(12) United States Patent
Murakami

(10) Patent No.: US 6,921,942 B2
(45) Date of Patent: Jul. 26, 2005

(54) STRUCTURE OF A LATERAL DIFFUSION MOS TRANSISTOR IN WIDESPREAD USE AS A POWER CONTROL DEVICE

(75) Inventor: Norio Murakami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/760,450

(22) Filed: Jan. 21, 2004

(65) Prior Publication Data

US 2005/0093060 A1 May 5, 2005

(30) Foreign Application Priority Data

Oct. 30, 2003 (JP) ........................................ 2003/370284

(51) Int. Cl.[7] .......................... H01L 29/76; H01L 29/94; H01L 31/062; H01L 31/113; H01L 27/01
(52) U.S. Cl. ..................... 257/332; 257/330; 257/347
(58) Field of Search ................................ 257/329, 330, 257/332, 334, 347, 352

(56) References Cited

U.S. PATENT DOCUMENTS

| 5,640,034 A | 6/1997 | Malhi |
| 6,188,104 B1 | 2/2001 | Choi et al. |
| 6,265,744 B1 * | 7/2001 | Okumura ................ 257/330 |
| 2002/0109184 A1 | 8/2002 | Hower et al. |

FOREIGN PATENT DOCUMENTS

| JP | 06-097450 | 4/1994 |
| JP | 07/074352 | 3/1995 |
| JP | 09-139438 | 5/1997 |
| JP | 10-294463 | 11/1998 |
| JP | 2002-237591 | 8/2002 |

* cited by examiner

Primary Examiner—Ngân V. Ngô
(74) Attorney, Agent, or Firm—Volentine Francos & Whitt PLLC

(57) ABSTRACT

There is provided a semiconductor device structured so as to be mounted jointly with other devices on one chip, and capable of controlling a large current in spite of a small device area while having small on-resistance, thereby enabling a high voltage resistance to be obtained. In the case of NLDMOS, the semiconductor device comprises an N well layer, formed on a p-type semiconductor substrate, a P well layer formed in the N well layer, a source electrode formed in a source trench cavity within the P well layer, a gate electrode formed in at least one of gate trench cavities within the P well layer, through the intermediary of an oxide film, and a drain electrode formed in a drain trench cavity within the N well layer, and further, N+ diffused layers are formed, around the source trench cavity, the drain trench cavity, respectively.

18 Claims, 4 Drawing Sheets

STRUCTURE OF A LATERAL DIFFUSION MOS TRANSISTOR IN WIDESPREAD USE AS A POWER CONTROL DEVICE

FIELD OF THE INVENTION

The present invention relates to a semiconductor device, particularly, to a structure of an LDMOS (Lateral Diffusion MOS) transistor in widespread use as a power control device for a motor, relay, and so forth, and a process of fabricating the same.

BACKGROUND OF THE INVENTION

A conventional LDMOS device has been in widespread use as an IC device for power control that can be mounted jointly with other semiconductor devices on a chip by forming diffused layers in the lateral direction thereof. FIG. 4 shows a basic structure of a conventional n-channel LDMOS by way of example.

The conventional n-channel LDMOS comprises a p-type silicon substrate 1, an N well layer 2 serving as a drain layer of the LDMOS, a P well layer 3 serving as a substrate of an N-channel MOS, a LOCOS oxide film 4 of a large thickness for the purpose of isolation and mitigation of a drain-to-gate electric field, a gate oxide film 5, a gate electrode (polysilicon film) 6, an N + diffused layer 7 for forming a source and drain, a P + diffused layer 8 for taking out a potential of the P well layer, an insulating layer (for example, a PSD layer by CVD) 9 for insulation of a wiring layer from a transistor region, a metal interconnect layer 10, and a passivation layer 11 for protection of a device.

The device is operated as follows. A desired voltage is applied to the gate electrode 6, whereupon a current channel layer is induced in a surface region of the P well layer 3 as the substrate, directly underneath the gate, thereby causing a current between a drain and a source to flow from the N well layer 2 as a drain region to a source region.

However, advances have recently been made in downsizing and lower power consumption of electronic equipment accompanied by rapid progress in miniaturization of semiconductor devices employed by the electronic equipment. In particular, pronounced miniaturization has since been made in common logic MOSLSIs constituting a system LSI. Meanwhile, there have been made continued efforts for research and development on downsizing of power devices for controlling relatively large power, such as, for example, a high voltage resistant device (HV-CMOS), and LDMOS.

Particularly, in the case of the LDMOS, downsizing thereof is essential in order to mount it jointly with other devices (CMOS logic circuit, bipolar circuit, and so forth) on one chip. Paten Documents 1, 2, i.e. JP-A 1994-97450 and JP-A 1995-74352, each show a structure for obtaining a high voltage resistant LDMOS transistor while shortening cell pitches by providing a trench in a gate region or between a gate and drain.

Further, in Paten Document 3, namely, JP-A 1997-139438, there is described a structure wherein a parasitic bipolar transistor is formed together with a substrate so as to form a current path when a reverse voltage is applied to a drain, thereby preventing destruction of a device. Still further, in Paten Document 4, namely, JP-A 1998-294463, there is described a structure of a vertical type device with a current path formed in the vertical direction thereof for preventing an electric field from being concentrated in a square part at the bottom of a gate trench, thereby preventing leak current.

With a semiconductor device for power control, however, a structure with a large area is still required in effecting power control, which has been the main stumbling block for implementing downsizing of LSI chips. Accordingly, with the conventional LDMOS structure, there has been a limitation to downsizing of a power control system.

SUMMARY OF THE INVENTION

In view of the problem described, the invention has been developed, and it is an object of the invention to provide a novel and improved semiconductor device structured so as to be mounted jointly with other devices on one chip, and capable of controlling a large current in spite of a small device area while having small on-resistance, thereby enabling a high voltage resistance to be obtained.

To resolve the problem described, in accordance with a first aspect of the invention, there is provided a semiconductor device comprising a layer of a second conductivity, formed on top of a substrate of a first conductivity, a layer of the first conductivity, formed inside the layer of the second conductivity, a source electrode formed in a trench cavity surrounded by a first heavily doped region of the second conductivity, inside the layer of the first conductivity, a drain electrode formed in a trench cavity surrounded by a second heavily doped region of the second conductivity, inside the layer of the second conductivity, and a gate electrode formed in at least one of trench cavities, having a sidewall in contact with the first heavily doped region, located on one edge of the layer of the first conductivity and between the source electrode and the drain electrode, through the intermediary of an oxide film covering the inner surface of the trench cavities.

With an LDMOS that is the semiconductor device of the above-described configuration, since current flows along the gate electrode formed in the respective trench cavities, inside the substrate, it is possible to secure a channel corresponding to a depth of the trench cavities on the outer side faces of the trench cavities. Furthermore, since a current between a source and drain is dependent on the depth of the trench cavities, a device area can be developed without taking into account a gate length and gate width on a plane as with the case of a conventional LDMOS transistor, thereby enabling a large current to be controlled. Furthermore, since the source electrode and drain electrode are formed in the trench cavities, respectively, paths of current flowing through conduction layers in the substrate become shorter, and the current can directly reach the electrodes, so that on-resistance of the device can be further reduced. Further, the invention is applicable to either a PMOS or the NMOS.

Herein, a plurality of the trench cavities for the gate electrodes are preferably disposed in a line in the direction of a channel width. In this case, the direction of the channel width refers to a direction normal, or perpendicular to a direction in which a current flows from the drain electrode to the source electrode. Thus, a channel serving as a current path is induced on respective side faces of the plurality of the trench cavities, so that larger current can be controlled without increasing the device area. Further, it is desirable to form the trench cavities for the gate electrodes substantially in the shape of a column, thereby preventing malfunction due to electric field concentration, and so forth.

Further, the trench cavities for the gate electrodes preferably have a depth equal to a depth of the first heavily doped region for reduction of the on-resistance. Furthermore, an impurity concentration of the layer of the first conductivity is preferably rendered higher than that of the layer of the second conductivity forming the drain electrode, thereby extending a depletion layer toward the drain side, so that a short channel effect can be prevented, and a higher voltage resistance of the drain can be attained.

The structure of the present invention can be applied to a SOI substrate provided with an insulating oxide film layer formed underneath the layer of the second conductivity type. In this case, the thickness of the layer of the first conductivity type formed in the layer of the second conductivity type so as to be smaller than that of the layer of the second conductivity type as in the case of a common bulk substrate can be rendered the same as the thickness of the layer of the second conductivity type. With the SOI structure adopted, occurrence of a parasitic bipolar transistor can be prevented and parasitic capacitance can be reduced, thereby preventing malfunction of operation and enabling high-speed operation and low current consumption to be achieved, so that the device can obtain more excellent characteristics.

Now, in order to obtain the semiconductor device described in the foregoing, there is also provided a process of fabricating a semiconductor device, comprising the steps of forming a layer of a second conductivity, on top of a substrate of a first conductivity, forming a layer of the first conductivity, inside the layer of the second conductivity, forming two trench cavities one of which is located on one edge of the layer of the first conductivity, adjacent to the layer of the second conductivity, inside the layer of the first conductivity, and forming one trench cavity inside the layer of the second conductivity, forming an oxide film on the inner surface of the trench cavity of the two trench cavities formed inside the layer of the first conductivity, formed so as to be closer to the layer of the second conductivity, embedding electrode metals to serve as a source electrode, drain electrode, and gate electrode, in respective trench cavities,; and forming a first heavily doped region of the second conductivity around the source electrode, so as to be in contact with a sidewall of the trench cavity for the gate electrode, and forming a second heavily doped region of the second conductivity around the drain electrode.

By forming a source trench cavity and gate trench cavities inside the layer of the first conductivity, and forming a drain trench cavity inside the layer of the second conductivity; the LDMOS semiconductor device according to the invention can be obtained. Further, since a drain voltage resistance is varied depending on a distance between the sidewall of the respective trench cavities for the gate electrodes and the second heavily doped region surrounding the trench cavity for the drain electrode, the distance can be decided upon so as to be able to obtain a desired drain voltage resistance.

The first heavily doped region formed around the trench cavity for the source electrode is preferably in contact with a part of the sidewall of each of the trench cavities for the gate electrodes, however, even if there occurs a minute gap in several tenths of a micron therebetween in the course of fabrication , this will create no problem with the operation of the transistor.

As described in detail hereinbefore, with the invention, by utilizing the source trench cavity, gate trench cavities, and drain trench cavity that are formed in the substrate, the current paths are provided in the substrate to thereby perform operation, so that it is possible to control current by virtue of a distance in the direction of the depth of the gate trench cavities, thereby enabling the device area on a plane to be considerably reduced. Thus, the downsizing of the LDMOS can be implemented, thereby contributing to the downsizing of a semiconductor device for power control, that is, the downsizing of a system.

BRIEF DESCRIPTION OF THE DRAWINGS

FIG. 1 (b) is a plan view illustrating the structure of the LDMOS according to the first embodiment;

FIG. 2 (c) is a sectional view illustrating the process of fabricating the LDMOS in FIG. 1 (a) according to the second embodiment of the invention after the step of forming respective trench cavities;

FIG. 2 (d) is a sectional view illustrating the process of fabricating the LDMOS in FIG. 1 (a) according to the second embodiment of the invention after the step of embedding polysilicon in the respective trench cavities;

FIG. 2 (e) is a sectional view illustrating the process of fabricating the LDMOS in FIG. 1 (a) according to the second embodiment of the invention after the step of forming N + diffused layers;

FIG. 2 (f) is a sectional view illustrating the process of fabricating the LDMOS in FIG. 1 (a) according to the second embodiment of the invention after the step of forming a metal interconnect layer and passivation layer;

PREFERRED EMBODIMENTS OF THE INVENTION

Figure 1A:
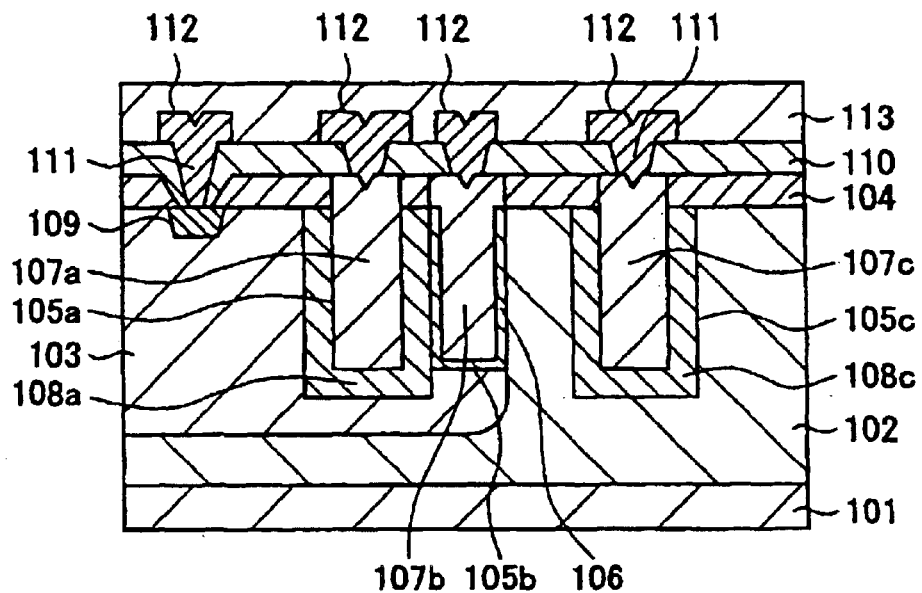
FIG. 1 (a) is a sectional view illustrating a structure of an LDMOS according to a first embodiment of the invention.

Preferred embodiments of the invention are described in detail hereinafter with reference to the accompanying drawings. In the present specification and the accompanying drawings, constituents having substantially the same function and constitution are denoted by like reference numerals, thereby omitting duplicated description. First Embodiment FIG. 1 (a) is a sectional view illustrating a trench type LDMOS, that is, a first embodiment of a semiconductor device according to the invention. With the present embodiment, an NMOS is described as an example. The trench type LDMOS comprises an N well layer 102 of a second conductivity type, formed on a p-type semiconductor substrate 101, that is, a substrate of a first conductivity type, a P well layer 103 of the first conductivity type, formed in the N well layer 102, a source electrode 107a, a gate electrode 107b, formed in a source trench cavity 105a, a gate trench cavity 105b, respectively, within the P well layer 103, and a drain electrode 107c formed in a drain trench cavity 105a within the N well layer 102.

Further, in order to form the source electrode and the drain electrode, an N + diffused layer 108a which is a first heavily doped region of the second conductivity is formed around the source trench cavity 105a, and an N + diffused layer 108c which is a second heavily doped region of the second conductivity is formed around the drain trench cavity 105c. Further, an oxide film 106 to serve as a gate oxide is formed on the inner surface of the gate trench cavity 105b, and the gate electrode 107b is formed on top of the oxide film 106.

Further, a P + diffused layer 109 which is a heavily doped region of the first conductivity type may be formed within the P well layer 103 to enable a potential of the P well layer 103 to be taken out. In addition, a field oxide form 104 for effecting isolation between elements adjacent to each other is formed on the surface of the p-type semiconductor substrate 101. The P + diffused layer 109 and the respective electrodes are connected to a metal interconnect layer 112 through respective contact holes 111 formed in an intermediate insulating layer 110.

The intermediate insulating layer 110 for insulating the metal interconnect layer 112 from an underlying element region is formed of a PSG film formed by, for example, CVD process. Further, a passivation layer 113 is formed on top of the metal interconnect layer 112.

Figure 1B:
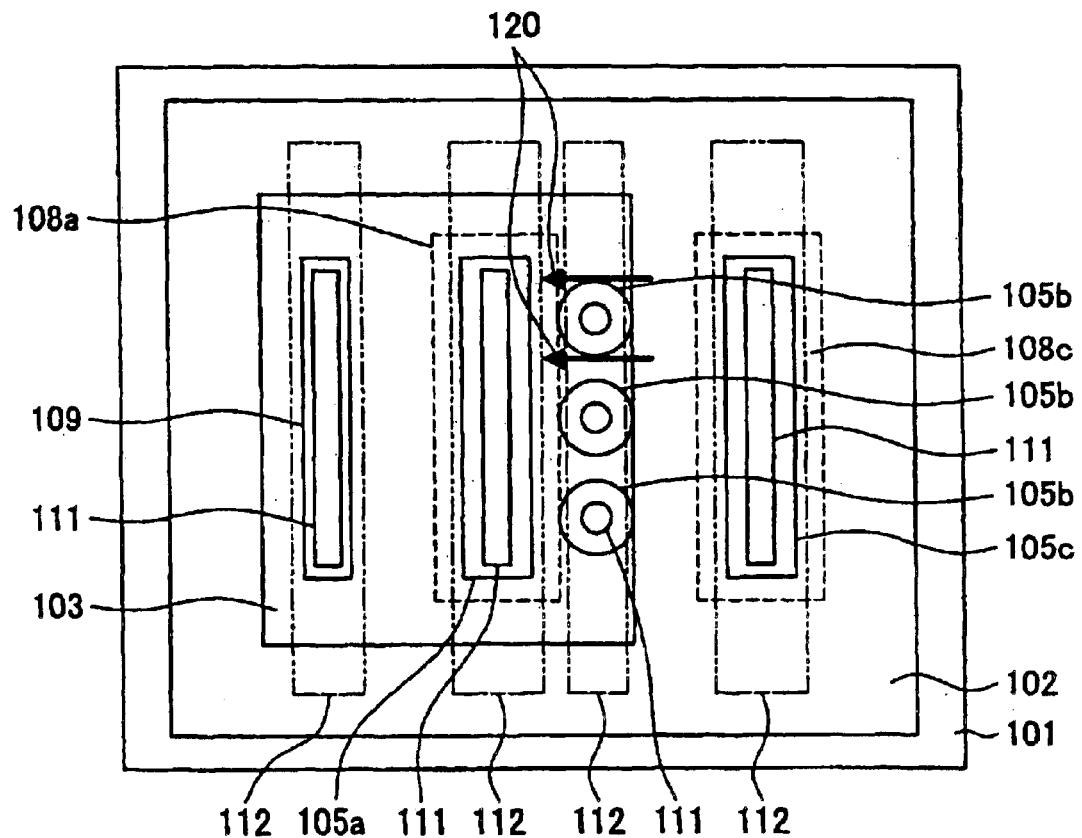

FIG. 1 (a) is a plan view illustrating the trench type LDMOS, that is, the semiconductor device according to the present embodiment of the invention. In this case, the trench type LDMOS has a configuration having three gate trench cavities, and directions 120 of current flows controlled by the gate trench cavity at one spot are indicated by the arrows in the figure.

The semiconductor device according to the present embodiment has a feature in that with respect to the gate trench cavity at one spot, conduction occurs, in other word; a current flow is controlled at two spots along the sidewall of the respective gate trench cavities. That is, since a current flow channel is induced at two spots, it follows that current is controlled with a channel width (corresponding to a gate width of a conventional MOS transistor) about twice as large as a depth of the gate trench cavity -with respect to one of the gate trench cavities.

With the present embodiment, the gate trench cavities 105b are formed at three spots so as to be arranged in a line in the direction of a channel width. With respect to one of the gate trench cavities, a current flow occurs at the two spots along the sidewall of the gate trench cavity, so that if there are three gate trench cavities, a current flow will occur at six spots along the respective sidewalls of the gate trench cavities. It therefore follows that the more the number of the trench cavities is, the larger current controlled can be, so that a large current channel can be induced and on resistance can be reduced without increasing a device area.

Naturally, however; because there is the need for setting an appropriate spacing between the trench cavities adjacent to each other such that respective channels induced along the sidewalls of the trench cavities adjacent to each other will not come into contact with each other, the number of the trench cavities is set after taking into consideration design values such as an electrode width, a current amperage, and so on.

Further, a source and a drain are rendered equivalent in depth to each other by utilizing the source trench cavity 105a, and the drain trench cavity 105c, respectively, so that the current flows in sidewall regions of the respective gate trench cavities can directly reach the electrodes without passing through conduction layers in the substrate, along a long distance, respectively, resulting in reduction of the on-resistance. Further, the source trench cavity 105a and the drain trench cavity 105c are rendered so as to be a trench substantially rectangular in plane shape, respectively, thereby enabling the current flows along the sidewalls of a plurality of the gate trench cavities to occur efficiently.

Meanwhile, the gate trench cavities 105b each are formed in the shape of a column, and by doing so, it is possible to prevent electric field concentration, thereby enhancing reliability (such as voltage resistance, and so on of the gate insulating film). Further, even if the gate trench cavities 105b each extend over the N well layer 102, there will occur no operational problem, however, if the gate trench cavities 105b each are formed at a position inside the P well layer 103, away at a predetermined distance or more from the position of the boundary between the P well layer 103 and the N well layer 102, the semiconductor device according to the present embodiment will not operate as a transistor. Accordingly, the gate trench cavities 105b each are preferably located on one edge inside the P well layer 103 therewithin, that is, at a position adjacent to the N well layer 102.

The N + diffused layer 108a surrounding the source trench cavity 105a is preferably in contact with the respective sidewalls of the gate trench cavities 105b. If the N + diffused layer 108a is away at a distance from the respective gate trench cavities 105b, there can be a case where no channel is formed depending on an impurity concentration -of the P well layer 103, and the present semiconductor device does not operate. Further, in order that a channel is induced throughout a face on the outer side of the gate trench cavities 105b, and on-resistance is reduced to thereby obtain excellent characteristics, the source trench cavity. 105a is preferably formed such that a depth thereof is slightly shallower that that of the gate trench cavities 105b while the N + diffused layer 108c is preferably formed such that a depth thereof is equal to that of the gate trench cavities 105b.

Because not only the impurity concentration of the P well layer 103 as well as the N well layer 102 but also a distance between the respective sidewalls of the gate trench cavities 105b and the N + diffused layer 108c surrounding the drain trench cavity 105c are related to a drain voltage resistance of the device, there is also the need for setting a distance between the gate trench cavities 105b and the N + diffused layer 108c in such a way as to be able to obtain the drain voltage resistance as desired. Further, by setting the impurity concentration of the P well layer 103 higher than that of the N well layer 102, a depletion layer is extended toward the side of the N well layer 102 (to the drain side), thereby enabling the drain voltage resistance to be rendered higher.

Figure 2A:
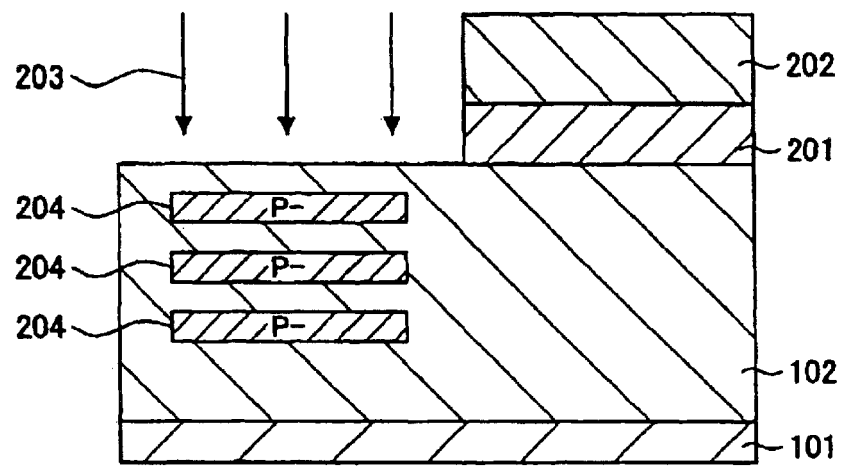
FIG. 2 (a) is a sectional view illustrating a process of fabricating the LDMOS in FIG. 1 (a) according to a second embodiment of the invention after the step of ion implantation executed in three stages for forming a P well layer, FIG. 2 (b) is a sectional view illustrating the process of fabricating the LDMOS in FIG. 1 (a) according to the second embodiment of the invention after the step of forming the P well layer by heat treatment.
Figure 2B:
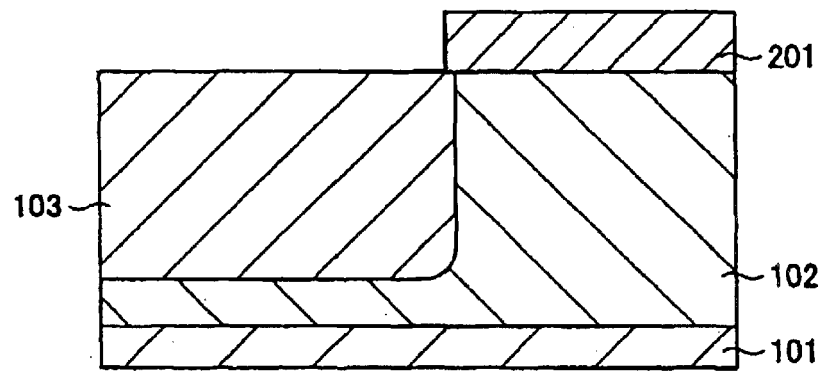
Figure 2C:
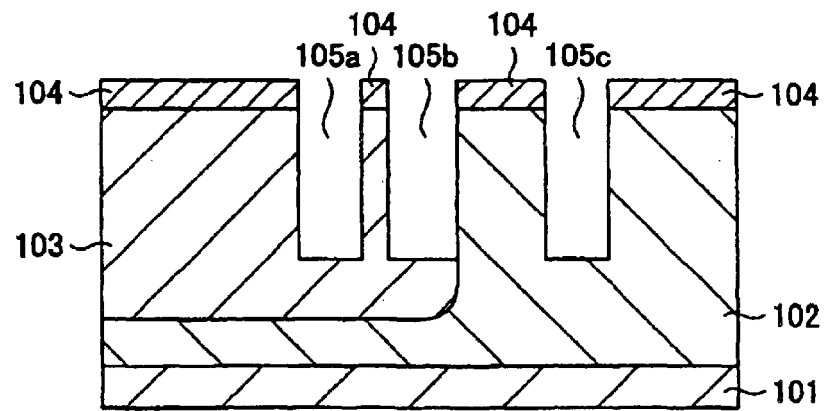
Figure 2:
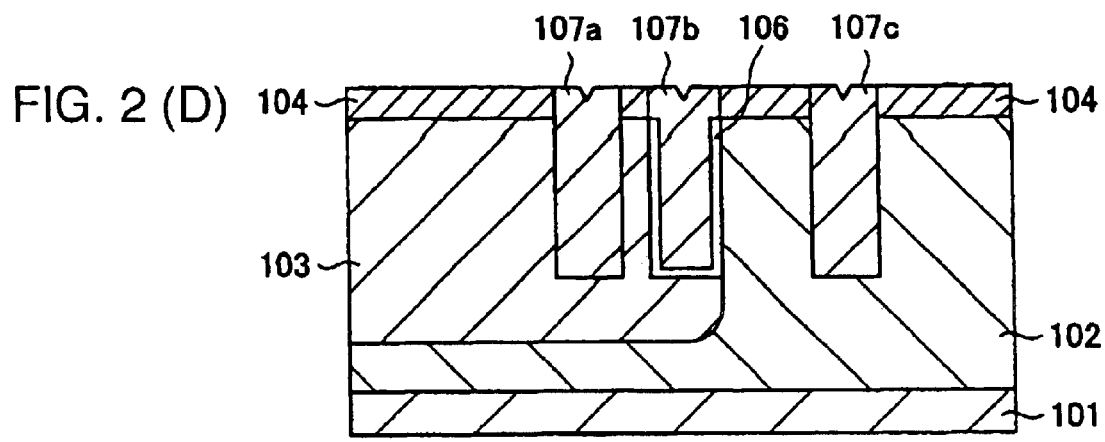
Figure 2:
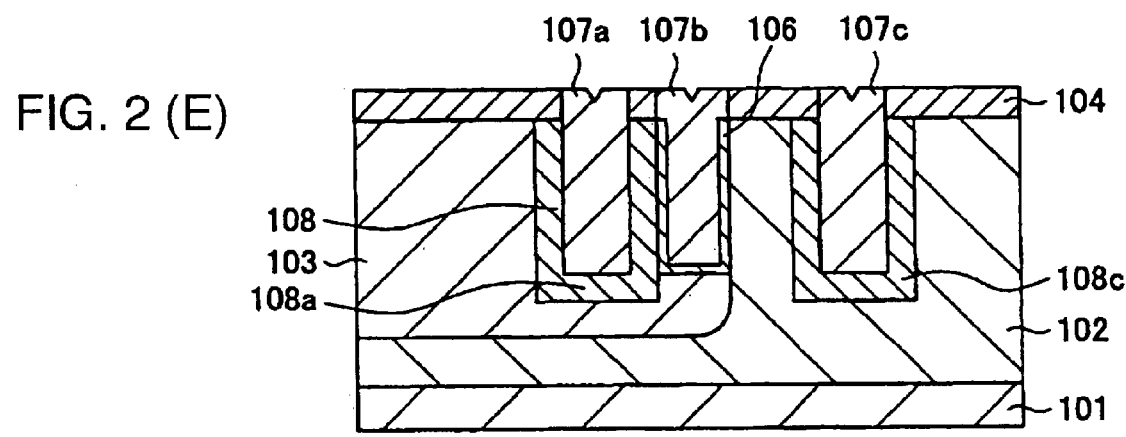
Figure 2:
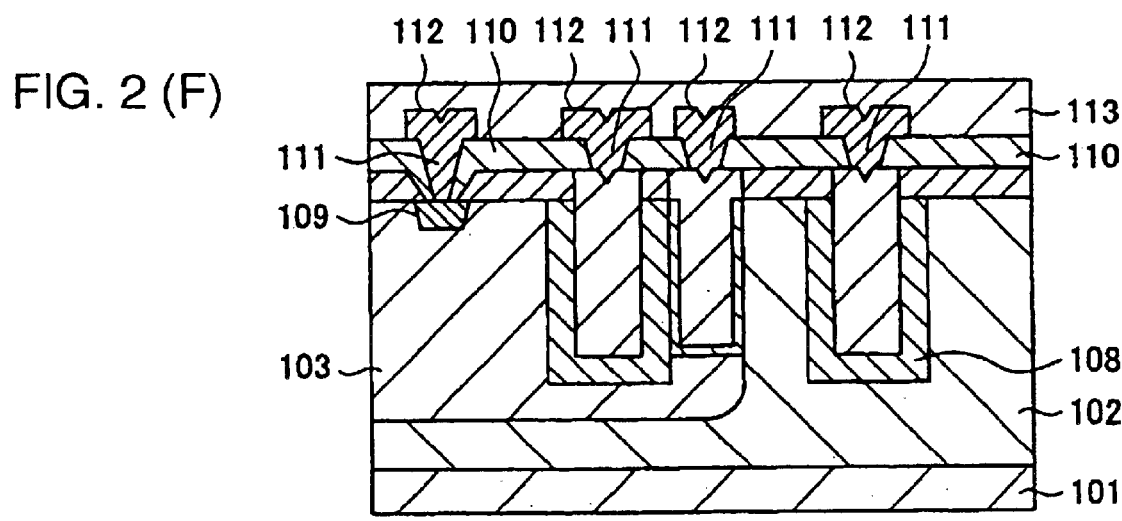

Thus, with the present embodiment, since the current flows in the LDMOS moves in the substrate, along the respective gate electrodes formed in the gate trench cavities, and the current between the source and the drain is dependent on a distance in the direction of the depth of the gate trench cavities, the device area can be developed on the basis of design parameters such as only a contact hole diameter, wiring width, and so forth irrespective of a gate width on a plane, and nevertheless, a large current can be controlled Second Embodiment Now, a process of fabricating the n-channel trench type LDMOS according to the first embodiment is described with reference to FIGS. 2 (a) through 2 (f). First, the p-type semiconductor substrate 101 is prepared. For the substrate, use can be made of a silicon substrate doped with, for example, boron and formed such that sheet resistance thereof has a resistance value at about 10 to 50 Ω cm.

Subsequently, desired regions of the p-type semiconductor substrate 101 are patterned by use of the well-known photolithography, and thereafter, the N well layer 102 is formed by use of ion implantation techniques and impurity diffusion techniques. The N well layer 102 has a thickness in a range of about 5 to 10 μm. Since the voltage resistance of the LDMOS is dependent on the impurity concentration of the N well layer 102, the impurity concentration is set by taking into account a specification voltage. The impurity concentration is normally on the order of 1 to 5 E 16 cm$^{-3}$.

Next, a silicon oxide film 201 is formed throughout the surface of the semiconductor device. A photoresist 202 is formed to a desired thickness on top of the silicon oxide film 201. After defining an opening in unnecessary regions of the photoresist 202 by application of exposure and development treatments, the silicon oxide film 201 is etched and further, ion implantation of, for example, boron ions 203 is executed using the silicon oxide film 201 and the photoresist 202 as masks. At this point in time, a film thickness of the silicon oxide film 201 and the photoresist 202, respectively, is set such that the boron ions 203 will not reach the p-type semiconductor substrate 101 after penetrating through the photoresist 202 and the silicon oxide film 201.

Further, with the present embodiment, the boron ion implantation is executed by varying ion implantation energies in three stages such that the respective energies reach different depths in the substrate. This is done in order to obtain uniform distribution of impurity concentration in the P well layer down to respective desired depths in the substrate. Accordingly, variation in the implantation energies is not necessarily limited to three stages, and the number of times at which ion implantation is repeated needs to be set to any suitable number so as to obtain uniformity in distribution. As the ion implantation energies in the three stages, there can be cited, for example, 300 KeV, 800 KeV, and 2MeV, respectively. FIG. 2 (a) shows boron distributions 204 in the substrate after the ion implantation executed in the three stages, respectively.

Thereafter, the photoresist 202 is removed, and heat treatment (annealing) at a high temperature around 1200° C. is applied, whereupon boron implanted in each of the three stages has substantially uniform distribution at respective depths in the substrate. A diffused layer of the boron becomes the P well layer 103. The P well layer 103 is set to be shallower in depth than the N well layer 102 so as to be kept inside the N well layer 102 {refer to FIG. 2 (b)}.

The P well layer 103 has a thickness on the order of 2 to 5 μm, and impurity concentration thereof, in a range of about 1E17 to 1E18 cm$^{-3}$ is appropriate. Thus, the N well layer 102 is formed on top of the p-type semiconductor substrate 101, and the P well layer 103 is formed inside the N well layer 102.

Next, after removal of the silicon oxide film 201, a silicon oxide film 104 is again formed to a thickness of several thousands angstroms throughout the surface of the device. The silicon oxide film 104 is utilized for isolation between elements as well, and is preferably set to have a film thickness sufficient for prevention of occurrence of a parasitic channel between elements adjacent to each other.

Further, it is conceivable to introduce an impurity for channel stop in parasitic channel regions in addition to the silicon oxide film 104 for insurance purposes. In such a case, boron is used as a dopant. These are the techniques well-known to those skilled in the art, and addition of various processes and alteration thereof are possible as necessary. As a method for isolation between elements, use can be made of the LOCOS method, STI (Shallow Trench Isolation) method, and so forth.

Further, after sequential execution of a photolithographic step, an oxide film etching step, and a silicon etching step, the source trench cavity 106a, gate trench cavity 105b, and drain trench cavity 105c are formed to respective desired depths in the source region, gate region and drain region, respectively.

Respective trench cavities for the source trench cavity 106a and the gate trench cavities 105b are formed inside the P well layer 103. As described with reference to the first embodiment, the gate trench cavities 105b are preferably formed on one edge of the P well layer 103. The trench cavities have a depth short of reaching the bottom of the P well layer 103, and the depth can be in a range of about 1 to 3 μm. Further, the drain trench cavity 105c is formed inside the N well layer 102 {refer to FIG. 2 (c)}.

Furthermore, a drain voltage resistance can be variously set by optionally setting a distance between the drain trench cavity 105c and the P well layer 103. According to a normal specification, the drain voltage resistance falls in such a very wide range as from about 10 to 1000V. Particularly, in the case of raising the voltage resistance of the n-channel LDMOS, it is necessary to prevent channel punch-through by extending the depletion layer toward the side of the N well layer 102 (toward the drain side). Accordingly, a relation of the impurity concentration of the P well layer 103 >the impurity concentration of the N well layer 102 is preferably set.

With the present embodiment, the source trench cavity 105a has an opening substantially rectangular in plane shape, and the gate trench cavities 105b are trenches at three spots arranged in a line in the direction of the electrode width, each having an opening circular in plane shape. The gate trench cavities are preferably formed substantially in the shape of a column in order to prevent electric field concentration, thereby enhancing reliability of the gate insulating film, such as voltage resistance, and so on. The plurality of the gate trench cavities are formed for the reason as described with reference to the first embodiment.

Next, the oxide film 106 to serve as the gate oxide film is formed to a thickness in a range of several tens to several hundreds angstroms by use of the thermal oxidation process. Further, by use of photolithography and etching, the gate oxide film 106 is selectively left out only inside the respective gate trench cavities, but is removed in other regions. Subsequently, by use of the CVD process, a polysilicon film doped with a dopant, such as phosphorus, arsenic, or the like, in concentration on the order of 1 to 5E20 cm$^{-3}$, and turned lower in resistance is formed to a thickness several hundreds angstroms on the entire surface in such a way as to be fully embedded inside the respective trench cavities.

At this time, as a constituent material for the respective electrodes, use may be made of a polycide which is a laminated film made of polysilicon doped with a dopant for lowering resistance of the electrodes and a metal with a high melting point (for example, Ti, Co, W, etc.) besides polysilicon.

Next, by use of CMP (Chemical Mechanical Polishing), or etch-back process, there is removed the polysilicon film other than that inside the source trench cavity, the respective gate trench cavities, and the drain trench cavity. The source electrode 107a, the gate electrodes 107b, and the drain electrode 107c are thus formed {refer to FIG. 2 (d)}.

Then, by application of an appropriate thermal diffusion treatment such as, for example, a process of diffusing an impurity of the polysilicon film into surroundings, the N + diffused layer 108a is formed around the source trench cavity 105c, and the N + diffused layer 108c around the drain trench cavity 105c {refer to FIG. 2 (e)}. It is desirable to design such that a part of the N + diffused layer 108a comes into contact with a part of the sidewall of each of the gate trench cavities 105b at this point in time. Even if a minute gap in several tenths of a micron occurs therebetween, however, this will create no problem with the operation of the transistor. Respective depths (diffusion spreads) of the N + diffused layer 108a and the N + diffused layer 108c may normally be set to a range of about 0.2 to 1 µm.

Next, there is deposited a CVD film (for example, the PSG film or a BPSG film) to serve as the intermediate insulating layer 110 to a thickness several thousands angstroms. Further, in order to connect the source electrode 107a, the gate electrodes 107b, and the drain electrode 107c with the wiring, there are formed the contact holes 111, and the metal interconnect layer 112 (for example, an aluminum film).

Figure 3:
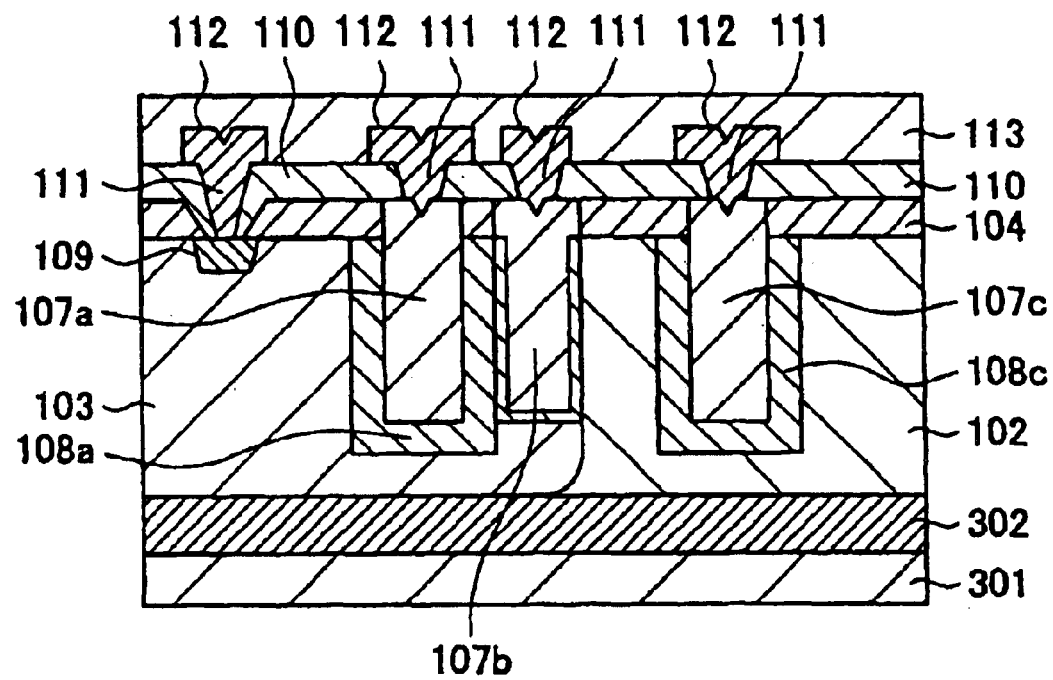
FIG. 3 is a sectional view illustrating the structure of an LDMOS formed on a SOI substrate according to a third embodiment of the invention.
Figure 4:
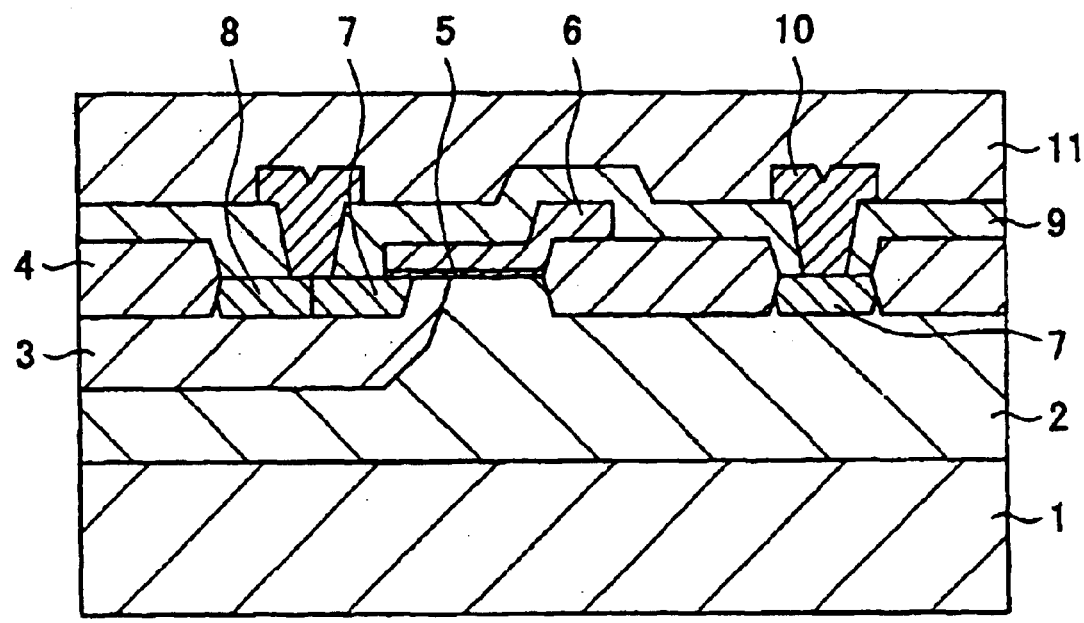
FIG. 4 is a sectional view illustrating the structure of a conventional LDMOS.

Furthermore, as described with reference to the first embodiment, the P + diffused layer 109 may be formed within the P well layer 103 so as to enable the potential of the P well layer 103 to be taken out. In such a case, the metal interconnect layer 112 is formed on the P + diffused layer 109 with the contact hole 111 formed thereon as well. Thereafter, the passivation layer 113 is formed for protection of the device {refer to FIG. 2 (f)}. Third Embodiment FIG. 3 is a sectional view illustrating a trench type LDMOS, that is, a third embodiment of a semiconductor device according to the invention. The third embodiment has a feature that an insulating oxide film layer is formed underneath the layer of the second conductivity type as described with reference to the first embodiment. That is, a SOI (Silicon On Insulator) substrate is used in place of the substrate used in the case of the first embodiment.

First, there is prepared the SOI substrate obtained by forming a polysilicon oxide film 302 as the insulating oxide film layer, on top of a p-type semiconductor substrate 301.doped with boron that is a substrate of a first conductivity type, serving as a support substrate, and further, by forming a silicon layer on the polysilicon oxide film 302. As is well known, for the SOI substrate, use may be made of any of those prepared by use of a lamination process, a doping process by implantation of oxygen ions, and so forth.

With the SOI substrate according to the present embodiment, there is no need for forming a P well layer 103 so as to be shallower in depth than an N well layer 102, so that the P well layer 103 and the N well layer 102 can be formed to the same thickness on the polysilicon oxide film 302. Otherwise, the present embodiment is the same in configuration as the first embodiment, and a process of fabricating the same also is substantially the same as that according to the second embodiment except that the SOI substrate is used, omitting therefore description thereof.

By adoption of a SOI structure as described, it is possible to prevent occurrence of a problem that a parasitic bipolar transistor {for example, a transistor formed by the p-type semiconductor substrate 101, the N well layer 102, and the P well layer 103, shown in FIG. 1 (a)} as described in Paten Document 5, namely, JP-A 2002-237591 is activated. Further, with the SOI structure adopted, a parasitic capacitance of the drain electrode can be reduced, thereby enabling high-speed operation and low current consumption to be achieved.

Having described the preferred embodiments of the invention as above with reference to the accompanying drawings, it goes without saying that the scope of the invention is not limited thereto. Obviously various variations and modifications of the present invention will occur to those skilled in the art without departing from the spirit and scope of the appended claims, and it is our intention that those variations and modifications naturally be construed within technical bounds of the claims.

With the above-described embodiments of the invention, description is given with reference to the n-channel LDMOS, however, the invention is similarly applicable to a p-channel LDMOS as well by substituting p-type elements for all the n-type elements as described.

The invention is applicable to the structure of the LDMOS transistor among semiconductor devices, and to the process of fabricating the same, and particularly, to the LDMOS transistor capable of controlling a large current while reducing the device area.

What is claimed is:

1. A semiconductor device comprising:
    a layer of a second conductivity, formed on top of a substrate of a first conductivity;
    a layer of the first conductivity, formed inside the layer of the second conductivity;
    a source electrode formed in a trench cavity surrounded by a first heavily doped region of the second conductivity, inside the layer of the first conductivity;
    a drain electrode formed in a trench cavity surrounded by a second heavily doped region of the second conductivity, inside the layer of the second conductivity; and
    a gate electrode formed in at least one of trench cavities, having a sidewall in contact with the first heavily doped region, located on one edge of the layer of the first conductivity and between the source electrode and the drain electrode, through the intermediary of an oxide film covering the inner surface of the trench cavities.

2. A semiconductor device comprising:
    a layer of a second conductivity, formed on top of an insulating oxide film layer of a SOI substrate with a substrate of a first conductivity type, serving as a support substrate thereof;
    a layer of the first conductivity, formed so as to be adjacent to the layer of the second conductivity, and on top of the insulating oxide film layer of the SOI substrate;
    a source electrode formed in a trench cavity surrounded by a first heavily doped region of the second conductivity, inside the layer of the first conductivity;
    a drain electrode formed in a trench cavity surrounded by a second heavily doped region of the second conductivity, inside the layer of the second conductivity; and
    a gate electrode formed in at least one of trench cavities, having a sidewall in contact with the first heavily doped region, located on one edge of the layer of the first conductivity and between the source electrode and the drain electrode, through the intermediary of an oxide film covering the inner surface of the trench cavities.

3. A semiconductor device according to claim 1, wherein a plurality of the trench cavities for the gate electrodes are disposed in a line in the direction of a channel width.

4. A semiconductor device according to claim 1, wherein the trench cavities for the gate electrodes are substantially in the shape of a column.

5. A semiconductor device according to claim 1, wherein impurity concentration of the layer of the first conductivity is higher than that of the layer of the second conductivity.

6. A semiconductor device according to claim 1, wherein a heavily doped region of the first conductivity type is formed within the layer of the first conductivity to take out a potential of the layer of the first conductivity.

7. A semiconductor device according to claim 1, wherein the trench cavities for the gate electrodes have a depth equal to a depth of the first heavily doped region surrounding the trench cavity for the source electrode.

8. A process of fabricating a semiconductor device, comprising:

forming a layer of a second conductivity, on top of a substrate of a first conductivity;

forming a layer of the first conductivity, inside the layer of the second conductivity;

forming two trench cavities one of which is located on one edge of the layer of the first conductivity, adjacent to the layer of the second conductivity, inside the layer of the first conductivity, and forming one trench cavity inside the layer of the second conductivity;

forming an oxide film on the inner surface of the trench cavity of the two trench cavities formed inside the layer of the first conductivity, formed so as to be closer to the layer of the second conductivity;

forming electrode metals to serve as a gate electrode, source electrode, and drain electrode, in the trench cavity with the oxide film formed therein, the other trench cavity formed inside the layer of the first conductivity, and the trench cavity formed inside the layer of the second conductivity, in that order, respectively, and forming a first heavily doped region of the second conductivity around the source electrode, so as to be in contact with a sidewall of the trench cavity for the gate electrode, and forming a second heavily doped region of the second conductivity around the drain electrode.

9. A process of fabricating a semiconductor device according to claim 8, wherein a plurality of the trench cavities for the gate electrodes are formed so as to be arranged in a line in the direction of a channel width.

10. A process of fabricating a semiconductor device according to claim 8, wherein the trench cavity for the gate electrode is formed substantially in the shape of a column.

11. A process of fabricating a semiconductor device according to claim 8, wherein the trench cavity for the gate electrode is formed such that a depth thereof is equal to a depth of the first heavily doped region surrounding the trench cavity for the source electrode.

12. A process of fabricating a semiconductor device according to claim 8, wherein a distance between the sidewall of the trench cavity for the gate electrode and the second heavily doped region of the second conductivity, surrounding the trench cavity for the drain electrode, is set in such a way as to be able to obtain a drain voltage resistance as desired.

13. A process of fabricating a semiconductor device, comprising:

forming a layer of a second conductivity, on top of an insulating oxide film layer of a SOI substrate provided with a substrate of a first conductivity type, serving as a support substrate;

forming a layer of the first conductivity on top of the insulating oxide film layer of the SOI substrate, so as to be adjacent to the layer of the second conductivity, and;

forming two trench cavities one of which is located on one edge of the layer of the first conductivity, adjacent to the layer of the second conductivity, inside the layer of the first conductivity, and forming one trench cavity inside the layer of the second conductivity;

forming an oxide film on the inner surface of the trench cavity of the two trench cavities formed inside the layer of the first conductivity, formed so as to be closer to the layer of the second conductivity;

forming electrode metals to serve as a gate electrode, source electrode, and drain electrode, in the trench cavity with the oxide film formed therein, the other trench cavity formed inside the layer of the first conductivity, and the trench cavity formed inside the layer of the second conductivity, in that order, respectively, and forming a first heavily doped region of the second conductivity around the source electrode, so as to be in contact with a sidewall of the trench cavity for the gate electrode, and forming a second heavily doped region of the second conductivity around the drain electrode.

14. A process of fabricating a semiconductor device according to claim 13, wherein a plurality of the trench cavities for the gate electrodes are formed so as to be arranged in a line in the direction of a channel width.

15. A process of fabricating a semiconductor device according to claim 13, wherein the trench cavity for the gate electrode is formed substantially in the shape of a column.

16. A process of fabricating a semiconductor device according to claim 13, wherein the layer of the first conductivity is formed such that impurity concentration thereof is higher than that of the layer of the second conductivity.

17. A process of fabricating a semiconductor device according to claim 13, wherein the trench cavity for the gate electrode is formed such that a depth thereof is equal to a depth of the first heavily doped region surrounding the trench cavity for the source electrode.

18. A process of fabricating a semiconductor device according to claim 13, wherein a distance between the sidewall of the trench cavity for the gate electrode and the second heavily doped region of the second conductivity, surrounding the trench cavity for the drain electrode, is set in such a way as to be able to obtain a drain voltage resistance as desired.

* * * * *